US010368464B2

(12) United States Patent
Chen et al.

(10) Patent No.: US 10,368,464 B2
(45) Date of Patent: Jul. 30, 2019

(54) THERMAL SOLUTION FOR TRANSCEIVER MODULE

(71) Applicant: QUANTA COMPUTER INC., Taoyuan (TW)

(72) Inventors: Chao-Jung Chen, Taoyuan (TW); Yu-Nien Huang, Taoyuan (TW); Kuen-Hsien Wu, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/783,043

(22) Filed: Oct. 13, 2017

(65) Prior Publication Data

US 2018/0376617 A1 Dec. 27, 2018

Related U.S. Application Data

(60) Provisional application No. 62/524,024, filed on Jun. 23, 2017.

(51) Int. Cl.
*H05K 7/20* (2006.01)
*G02B 6/42* (2006.01)

(52) U.S. Cl.
CPC ....... *H05K 7/20336* (2013.01); *G02B 6/4266* (2013.01); *H05K 7/20272* (2013.01); *H05K 7/20809* (2013.01); *H05K 7/20781* (2013.01); *H05K 7/20818* (2013.01)

(58) Field of Classification Search
None
See application file for complete search history.

(56) References Cited

U.S. PATENT DOCUMENTS 7,764,504 B2 * 7/2010 Phillips ................ G02B 6/4246 165/80.2
8,449,203 B2 * 5/2013 Downs ................ G02B 6/4269 361/707
9,882,646 B2 * 1/2018 Blumenthal ....... H05K 7/20336
2006/0291171 A1 * 12/2006 Ahrens ................ G02B 6/4292 361/716
2007/0253168 A1 * 11/2007 Miller .................. G02B 6/4246 361/719
2012/0099275 A1 * 4/2012 Regnier ............. H05K 7/20145 361/690

(Continued)

OTHER PUBLICATIONS

TW Office Action for Application No. 107103516, dated Jan. 24, 2019, w/ First Office Action Summary.

(Continued)

*Primary Examiner* — Courtney L Smith
(74) *Attorney, Agent, or Firm* — Nixon Peabody LLP; Zhou Lu

(57) ABSTRACT

A heat dissipating apparatus for cooling a transceiver is provided. The apparatus includes a cooling jacket configured to receive the transceiver. The transceiver is secured within the cooling jacket via a connecting structure. The apparatus also includes cooling devices secured to an exterior surface of the cooling jacket, the plurality of cooling devices comprising a highly thermal conductivity material. The apparatus also includes a heat dissipation device connected to a distal end of each of the plurality of cooling devices.

11 Claims, 4 Drawing Sheets

(56) References Cited

U.S. PATENT DOCUMENTS

| | | | | |
|---|---|---|---|---|
| 2013/0279115 | A1* | 10/2013 | Blumenthal | H05K 7/20336 361/700 |
| 2014/0160679 | A1 | 6/2014 | Kelty | |
| 2015/0013936 | A1* | 1/2015 | Mack | F28D 15/0275 165/53 |
| 2015/0029667 | A1* | 1/2015 | Szczesny | F28D 15/0275 361/700 |
| 2015/0077937 | A1* | 3/2015 | Daly | H04B 10/40 361/700 |
| 2016/0093996 | A1* | 3/2016 | Phillips | H01R 24/60 439/487 |
| 2016/0211626 | A1* | 7/2016 | Long | H01R 12/721 |
| 2017/0142864 | A1* | 5/2017 | Chanu | G02B 6/4268 |
| 2018/0049348 | A1* | 2/2018 | Bucher | H05K 7/20445 |

OTHER PUBLICATIONS

TW Search Report for Application No. 107103516, dated Jan. 24, 2019, w/ First Office Action.

* cited by examiner

THERMAL SOLUTION FOR TRANSCEIVER MODULE

CROSS REFERENCE TO RELATED APPLICATIONS

This application claims priority to U.S. Provisional Application No. 62/524,024 entitled "THERMAL SOLUTION FOR TRANSCEIVER MODULE", filed on Jun. 23, 2017, the contents of which are expressly incorporated by reference in its entirety.

FIELD OF THE INVENTION

The present invention relates to apparatuses for dissipating heat that emanates from individual electronic units within a switch device.

BACKGROUND

Typically, data centers have a large numbers of racks, each filled with various pieces of electronic components and equipment in data, computing, and/or communication systems. Electronics racks are standard components for mounting a variety of electronic components, such as servers. Multiple assemblies can be mounted in each rack, one above the other. These assemblies typically are supported by a front bezel formed from cut-outs in a flat piece of sheet metal that has clearance holes or slots along its edges to secure the bezel to the rack. Often, these assemblies are mounted relatively close to one another to fill the rack. The electronic components mounted within the rack often generate extreme heat. The heat generated needs to be removed from the rack to avoid overheating the various electronic components. Typically, cooling is provided by a fan that forces air across a heat sink in thermal contact with the temperature-sensitive, heat-producing electronic components.

The rapid increase in data storage and high bandwidth communication driven by Internet expansion is increasing the need for dense interconnection systems in data centers. These data centers are typically composed of rows of racks of servers. These servers need to be in high-bandwidth communication with other servers in the data centers. The high-bandwidth communication can be supported by either shielded electrical cables or increasingly active optical cables. Active optical cables support longer transmission distances and higher transmission bandwidths. An active optical cable typically has an optical engine incorporated into a transceiver on at least one end of the cable. The optical engine transforms electrical signals into optical signals (transmission [Tx] function), and transforms optical signals into electrical signals (receiver [Rx] function). An electronics rack can have hundreds or even thousands of interconnections, each of which generates heat that must be removed from the electronics rack. The inability to remove this heat can result in accelerated aging and/or premature failure of the interconnection of other components in the electronics rack. Therefore, there is a need to provide a cooling system in high speed communication devices that facilitates high-heat removal and dense packaging of the interconnections.

SUMMARY

Embodiments of the invention concern a heat dissipating apparatus for cooling a transceiver. An apparatus, according to the various embodiments, can include a cooling jacket configured to receive the transceiver. In some embodiments, the transceiver is secured within the cooling jacket via a connecting structure. The apparatus can include cooling devices secured to an exterior surface of the cooling jacket, where the cooling devices are made of a highly thermal conductivity material. The apparatus can also include a heat dissipation device connected to a distal end of each of the cooling devices.

In some embodiments of the invention, the heat dissipation device can include a radiator connected to a pipe that has cool water from a reservoir. Furthermore, in some embodiments of the invention, the cooling jacket includes a thermal conductivity material that is selected from the group of aluminum, copper, diamond, alloys, or composite materials. In an exemplary embodiment of the apparatus, the heat dissipation device includes at least one of a heat sink, a passive heat exchanger, and a fin. In some embodiments, the cooling devices include at least one heat pipe made up of highly conductive material. In an alternative exemplary embodiment of the apparatus, the cooling devices include at least one vapor chamber made up of highly conductive material.

DETAILED DESCRIPTION

Figure 1:
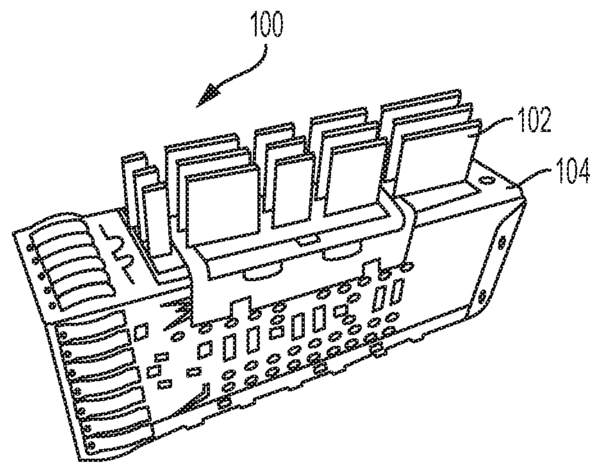
FIG. 1 shows a traditional transceiver with a heat sink installed on the topside of the transceiver housing.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In general, one implementation of the subject matter disclosed herein is directed to a cooling assembly for cooling pluggable transceivers. In one or more implementations, heat is moved from the transceiver housing towards the rear of the transceiver at a heat sink so that it can be dissipated into cooler air via a heat dissipation device, cooling fin, or the like. Cooling according to one or more implementations is external to the transceivers. In this implementation, a housing made of thermally conductive material is attached to the transceiver. Further, a highly thermally conductive material or device, such as a heat pipe, is attached to the sides and the top of the housing. The highly thermally conductive heat pipe is long enough to contact a radiator or the heat dissipation apparatus. The heat pipe(s) then transfers heat from the transceivers to the heat dissipation apparatus. The effectiveness of this technique can be enhanced by making portions of the housing of a highly thermally conductivity material and/or by widening the heat pipe(s) so there is more surface area of the in contact with the housing.

FIG. 1 shows a traditional transceiver 100. The transceiver 100 can be compatible with SFF-8436 QSFP+ multi-source agreement revision 4.8, Oct. 31, 2013, hereby incorporated by reference in its entirety. Other known types of transceivers include SFP, QSFP, microQSFP, etc. The transceiver shown in FIG. 1 can support transceiver power around 5-8 watts. The transceiver 100 can mate and unmate with receptacles in a rack (the receptacles and the rack are not shown in FIG. 1). The receptacles can be mounted to a printed circuit board (PCB). Mating the transceiver 100 to the receptacle creates mechanical and electrical connections. Electrical signals can be transported between the receptacle and the PCB. The transceiver 100 can include a heat sink 102 and an edge card 104. The heat sink 102 is traditionally mounted directly on the topside of the transceiver 100 such that the position of the heat sink is fixed when the transceiver is mated with the one of the receptacle connectors. Typically, the heat sink 102 can include an extrusion or bent sheet metal. The heat sink 102 defines air flow paths. The edge card 104 can mate with a connector within the receptacle. The edge card 104 can transport electrical signals to/from the transceiver 100.

The transceiver 100 can be optical, electrical, or a hybrid of optical and electrical. If the transceiver 100 is optical, then a connecting cable (not shown in FIG. 1) includes optical fibers that transport (i.e., receive and/or transmit) optical signals. The optical fibers can be single-mode or multimode fibers. The transceiver 100 can include an optical engine for transforming optical signals to electrical signals and/or electrical signals into optical signals.

If the transceiver 100 is electrical, then a connecting cable (not shown in FIG. 1) includes electrically conductive wires that transport electrical signals. The cable can be, for example, coaxial cable, which is sometimes referred to as coax. Coax includes a single conductor surrounded by a dielectric and a shield layer, and twinaxial cable, which is sometimes referred to as twinax. Twinax includes two conductors surrounded by a dielectric and shield layer. The cable can also include other suitable transmission lines. The transceiver 100 can include contain electronic circuitry that transport electrical signals, including, for example, high-bandwidth electrical signals.

If the transceiver is a hybrid, then a connecting cable (not shown in FIG. 1) includes both optical and electrical cables. In this configuration, the transceiver 100 includes both an optical engine that transforms optical signals into electrical signals and/or electrical signals into optical signals. Such a transceiver can also include and electronic circuitry appropriate for transmitting and/or receiving electrical signals from the electrical cable.

Figure 2:
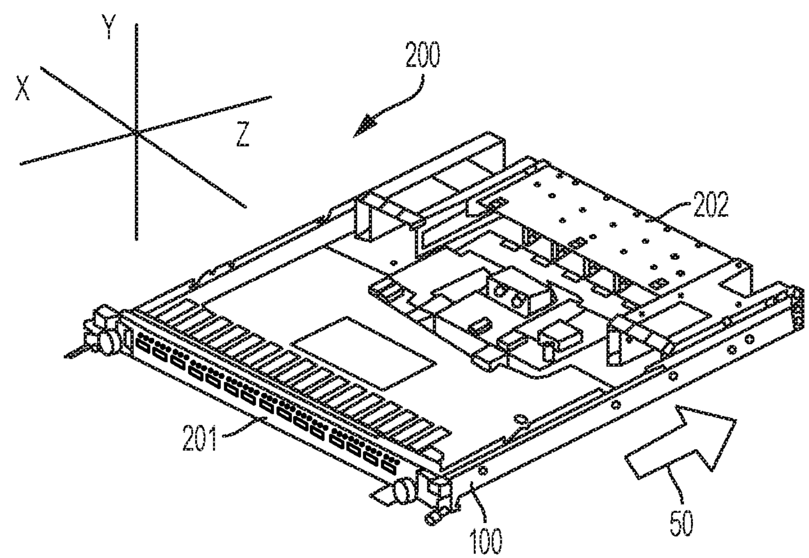
FIG. 2 shows a traditional switch device that includes, among other elements, a plurality of traditional transceiver devices with a heat sink installed on the topside of the transceiver housing.

FIG. 2 shows a traditional switch device 200. In some embodiments, the switch device 200 includes a plurality of transceivers 100. The switch device 200 can include a front end 201 and a rear end 202. The air flow 50 can come across the switch device 200, and the encompassed plurality of transceivers 100 from the front end 201 to the rear end 202 via a plurality of fan modules (not shown in FIG. 2). The plurality of fan modules are typically mounted adjacent to the heat sink such that the plurality of fans direct forced air over the heat sink. Air preferably flows in one or more air-flow paths between the extrusion or bent sheet metal. It should be realized that the switch device 200 includes other components not mentioned herein. The components mentioned above are only for example, and not to limit this disclosure. A person having ordinary knowledge in the art may flexibly include other components in accordance with the invention.

As noted above, there is an increasing need for higher bandwidth transceivers. However, as channel density and bandwidth increases, the heat generated by transceivers in a switch, such as switch 200 increases. Excessive temperatures can lead to premature failure and poor performance. Thus, the various embodiments provide a new transceiver design with improved cooling, yet still maintain densely packaged high-bandwidth transceivers.

Figure 3:
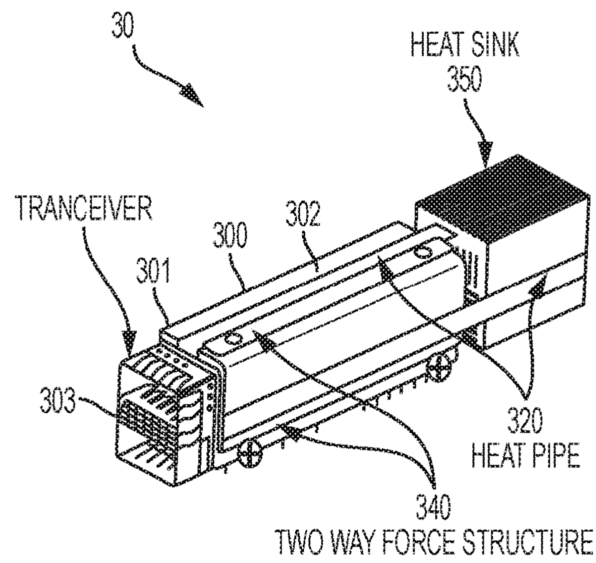
FIG. 3 is a diagram illustrating a transceiver cooling assembly according to one or more embodiments of the disclosure.

FIG. 3 is a diagram illustrating a transceiver cooling assembly 30 according to one or more embodiments of the disclosure. The cooling assembly 30 can include a transceiver 300, a heat dissipation device 350, and a cooling jacket 302. The transceiver 300 can include a body 301 and cable interface 303 to receive connecting cables. The cooling jacket 302 can include cooling devices 320 (e.g., heat pipes) coupled to the heat dissipation device 350. The cooling jacket 302 can be made from any thermal conductivity material, such as aluminum, copper, diamond, alloys, or composite materials. The cooling assembly 30 can be fastened together using a connecting structure 340. The connecting structure 340 is configured to secure the transceiver within the cooling jacket 302, which houses the cooling devices 320. In some embodiments, the connecting structure 340 is also configured to connect the transceiver 300 and the heat dissipation device 350 along the base of the connecting structure 340. In other embodiments, the heat dissipation device 350 can be directly connected to the cooling devices 320. The components of the cooling assembly 30 are discussed in greater detail below. Although described as cooling transceivers, the disclosed embodiments are not so limited. For example, the cooling assemblies described herein can be used to cool other electronic components (e.g., small form-factor electronic and/or optical input/output (I/O) devices).

In one or more implementations, the heat dissipation device 350 can be any suitable component that serves to dissipate thermal energy by conduction, convection, radiation, or the like. As used herein, the term "heat dissipation device" is meant to include any heat sink, passive heat exchanger, fin, or the like. The heat dissipation device may be made from any high thermal conductivity material, such as aluminum, copper, diamond, alloys, or composite materials. The heat dissipation device 350 can be coupled to the cooling devices 320 using thermal adhesive, thermal grease, or the like. In some embodiments, the heat dissipation device 350 can include a water cooling system. For example, a pipe carrying cool water from a reservoir, located locally or remotely from the switch, can be connected to the heat dissipation device 350.

In one or more implementations, the cooling devices 320 can include heat pipes or vapor chambers made from high thermal conductivity material. In some embodiments, heat pipes made of highly conductive material can be implemented. Such highly conductive material can include, for example, copper. In alternative embodiments, vapor chambers can be implemented. For example, the cooling devices 320 can include heat transfer devices that combine the principles of thermal conductivity and phase transformation. At a hot interface within the heat pipe, a liquid that is in contact with a thermally conductive solid surface of the heat pipe turns into a vapor by absorbing heat from the thermally conductive solid surface. The vapor then travels along the heat pipe to a cold interface, condenses back into liquid, and releases the latent heat. The liquid then returns to the hot interface either via capillary action or gravity, where it evaporates once more and repeats the cycle. In the illustrated implementation, the high thermal conductivity cooling devices 320 contact the cooling jacket 302. In one implementation, the high thermal conductivity cooling devices 320 can be adhered to the cooling jacket 302 using an adhesive, a clamp, or other suitable mechanism.

Figure 4:
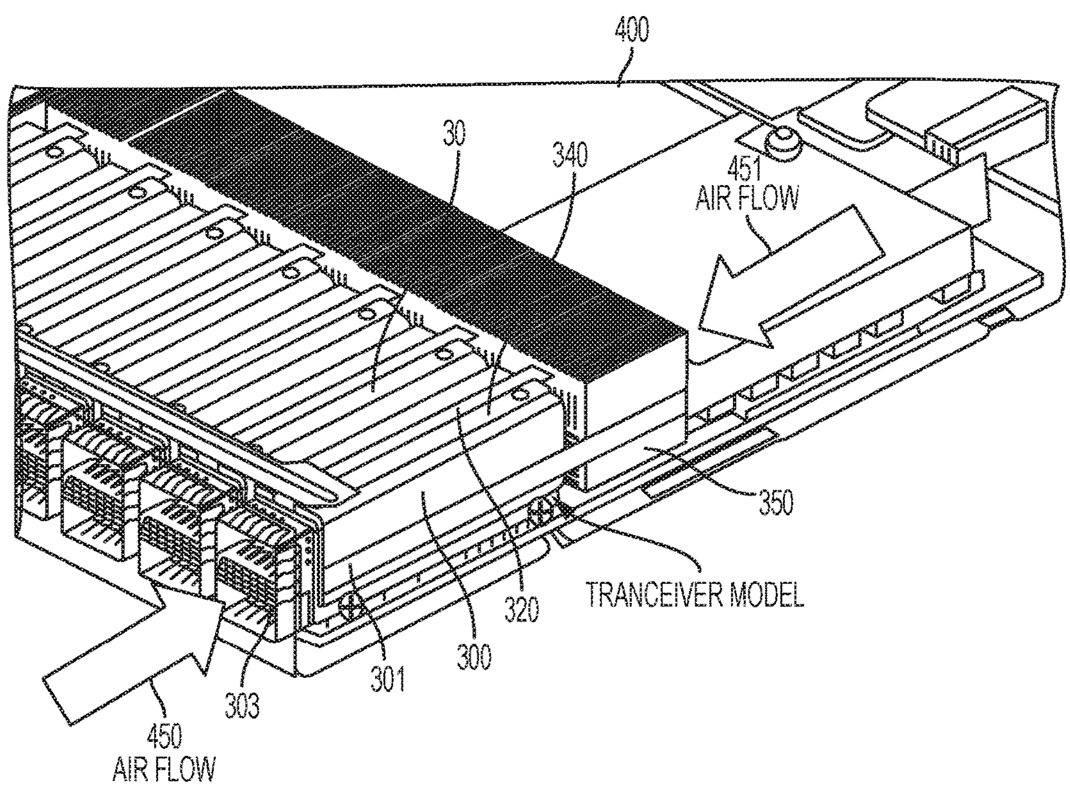
FIG. 4 shows a plurality of cooling assemblies installed in a switch device according to one or more embodiments of the disclosure.

FIG. 4 shows a switch device 400 with a plurality of transceivers and a corresponding plurality of cooling assemblies 30 installed according to one or more embodiments of the disclosure. In some implementations, more cooling is achieved by placing high thermal conductivity heat pipes on both sides and the top of the transceiver 300 (as partially shown in FIGS. 3 and 4). In this configuration, a plurality of transceivers, each configured with the disclosed cooling assembly 30, are installed into a switch device 400. The heat pipes can be between each transceiver 300, and run along the topside of each transceiver 300. The high thermal conductivity heat pipe (cooling device 320) can be located in the area that divides the transceivers. This cooling mechanism can be enhanced by ensuring the heat pipe is in contact with the transceiver 300. Thus, the cooling devices 320 are inserted into the cooling jacket 302 (as shown in FIG. 3) to minimize the distance between the cooling devices 320 and the transceiver 300. The high thermal conductivity heat pipe (cooling device 320) is small enough to be flushed with the cooling jacket 302. Moreover, the cooling jacket 302 is secured to the transceiver. Thus, the cooling devices 320 operate more efficiently in cooling down the transceiver 300. This is discussed in greater detail with respect to FIG. 6.

The cooling assembly can benefit from either air flow 450 or 451. That is, the disclosed cooling assembly 30 can benefit from airflow in either direction. Because heat is moved from the transceiver towards the distal end of the cooling assembly 30, it will receive cool air. That is, the heat is transported to another area and projected into the air stream with a heat dissipation device, cooling fin, or the like. Thus, the cooling assembly 30 provides flexibility in switch device 400 design. A plurality of cooling fans (not shown) can be installed in a variety of positions relative to the plurality of transceivers.

Figure 5A:
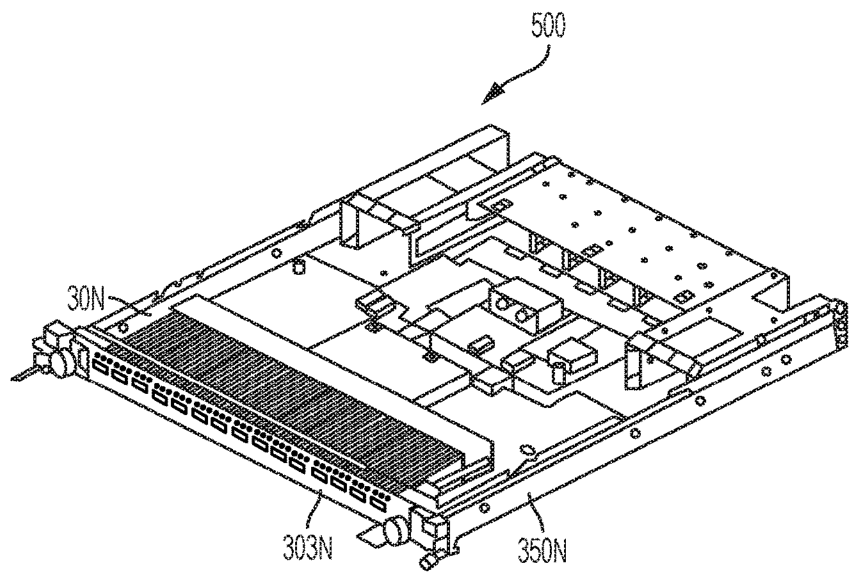
FIG. 5A shows a switch device with a plurality of cooling assemblies module installed according to one or more embodiments of the disclosure.

FIG. 5A shows a switch device 500 with a plurality of cooling assemblies module 30N installed according to one or more embodiments of the disclosure. It should be noted that while the cooling assembly 30 described above and shown in FIG. 3, is configured to fit a single transceiver 300, a plurality of cooling assemblies module 30N can act as a single cooling assembly configuration for a plurality of transceivers. The heat pipes can be between each transceiver 300, and run along the topside of each transceiver 300. The high thermal conductivity heat pipe (cooling device 320) can be located in the area that divides the plurality of transceivers. This cooling mechanism can be enhanced by ensuring each of the heat dissipation devices in a plurality of heat dissipation devices 350N are also in contact with one another.

Figure 5B:
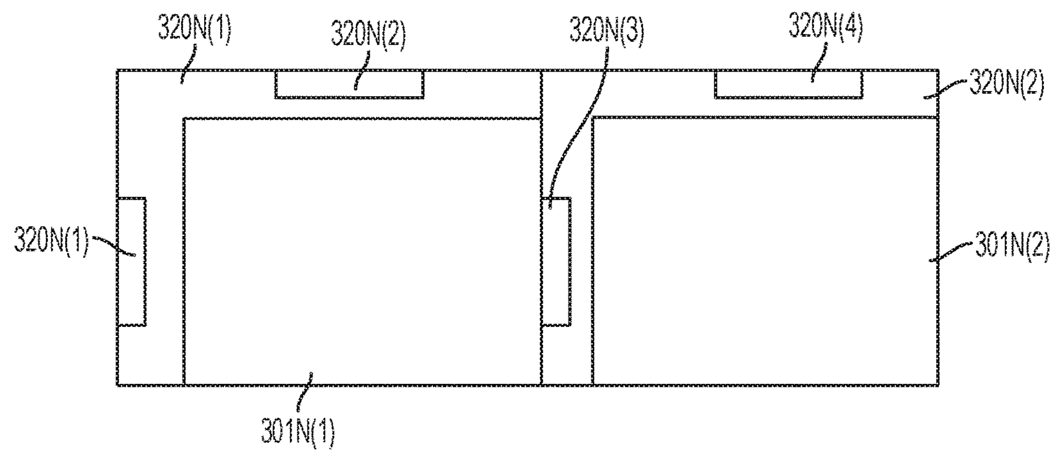
FIG. 5B is a cross-section view of two transceiver bodies of FIG. 5A disposed within cooling jackets.

FIG. 5B is a cross-section view of two transceiver bodies 301N(1) and 301N(2). Transceiver bodies 301N(1) and 301N(2) are disposed within cooling jackets 320N(1) and 320N(2), respectively. Cooling jacket 320N(1) can include cooling devices 320N(1) and 320N(2). Further, cooling jacket 320N(2) can include cooling devices 320N(3) and 320N(4). Because of the proximity of both transceiver bodies 301N(1) and 301N(2), cooling device 320N(3) can be shared by both transceiver bodies 301N(1) and 301N(2). In some embodiments, there may be a dozen transistors configured in this arrangement within a switch device. In addition, the plurality of heat dissipation devices 350(N) (shown in FIG. 5A) are arranged in close proximity. Thus, the plurality of heat dissipation devices 350N (shown in FIG. 5A) can act as a single heat dissipation device. As a result, the cooling assemblies module 30N (shown in FIG. 5A) can act as a single module cooling down a plurality of transistors within the switch device.

Figure 6A:
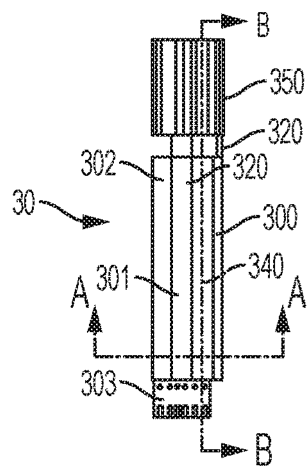
FIG. 6A shows a top view of the transceiver cooling assembly 30 of FIG. 3 according to one or more embodiments of the disclosure.
Figure 6B:
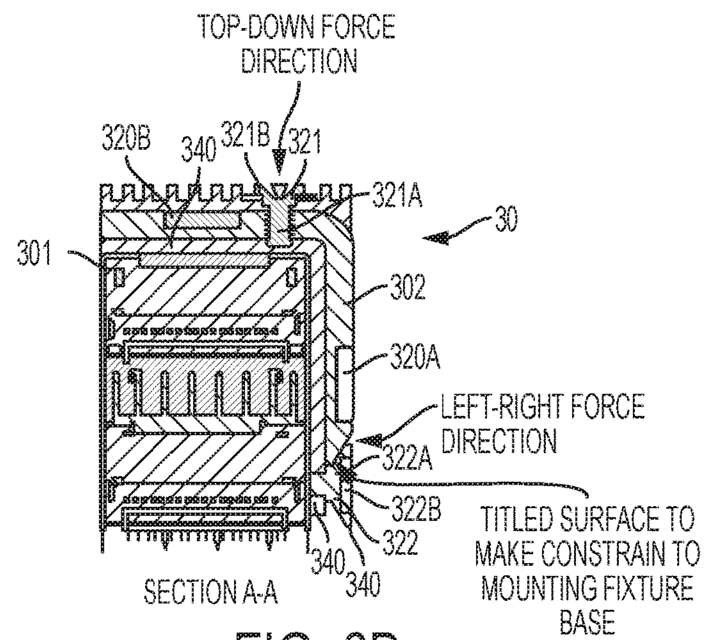
FIG. 6B is a cross-section view through cutline A-A of FIG. 6A.
Figure 6C:
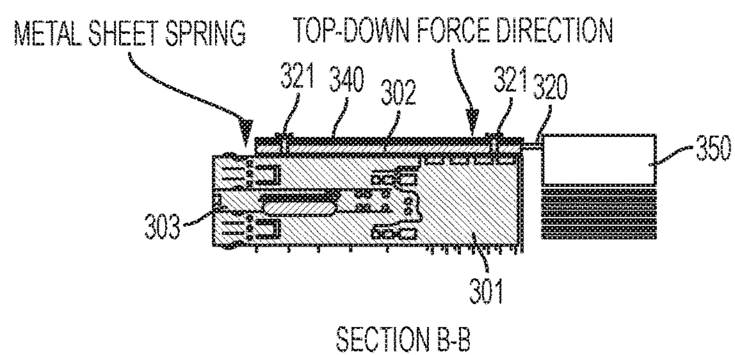
FIG. 6C is a cross-section view through cutline B-B of FIG. 6A.

FIG. 6A shows a top view of the transceiver cooling assembly 30 of FIG. 3, according to one or more embodiments of the disclosure. The transceiver cooling assembly 30 includes cut-away views A-A and B-B to be discussed with reference to FIG. 6B and FIG. 6C, respectively. FIG. 6B is a cross-section view through cutline A-A of FIG. 6A. FIG. 6C is a cross-section view through cutline B-B of FIG. 6A. In the illustrated view, it can be seen how the cooling devices 320A and 320B are placed within the cooling jacket 302. The cooling devices 320A and 320B are positioned within the cooling jacket 302 such that the cooling devices 320A and 320B are flush with the cooling jacket 302 on the exterior. The cooling devices 320A and 320B can be coupled to the cooling jacket 302 using thermal adhesive, thermal grease, or the like. Furthermore, the cooling devices 320A and 320B can be coupled to the cooling jacket 302 using spot welding, or other known means of conjoining the two high thermal conductivity materials.

The cooling jacket 302 is connected to the connecting structure 340 via fixing elements 321 and 322. The fixing element 321 can include an assembly screw 321B with a thread 321A on the front shank engaging in the cooling jacket 302. The fixing element 322 can include an assembly screw 322B with a thread 322A on the front shank engaging in the cooling jacket 302. Once the cooling jacket 302 is secured to the connecting structure 340, the connecting structure 340 is secured to the body 301 of the transceiver 300. Thus, heat generated from the transceiver 300 can be passed from the body 301 through the connecting structure 340 to the cooling jacket 302 and out to the cooling devices 320A and 320B. At that point, the cooling devices 320A and 320B become a heat transporter carrying heat from the transceivers to the cooler region of the cooling assembly 30. The effectiveness of this technique can be enhanced by making both the connecting structure 340 and the cooling jacket 302 out of a highly thermally conductivity material and/or by widening the cooling devices 320A and 320B so there is more surface area of the in contact with the cooling jacket 302.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An apparatus for cooling a transceiver, the apparatus comprising:

a cooling jacket configured to receive the transceiver, wherein the transceiver is secured within the cooling jacket via a connecting structure;

a plurality of cooling devices secured to an exterior surface of a housing, wherein the plurality of cooling devices comprises a highly thermal conductivity material, the plurality of cooling devices including a heat pipe running along the topside of the transceiver; and a heat dissipation device connected to a distal end of each of the plurality of cooling devices, wherein the heat dissipation device comprises a radiator connected to a pipe comprising cool water from a reservoir.

2. The apparatus of claim 1, wherein the cooling jacket comprises a thermal conductivity material, selected from a group of aluminum, copper, diamond, alloys, or composite materials.

3. The apparatus of claim 1, wherein the heat dissipation device comprises at least one of a heat sink, a passive heat exchanger, and a fin.

4. The apparatus of claim 1, wherein the heat pipe comprises highly conductive material.

5. The apparatus of claim 1, wherein the plurality of cooling devices comprises at least one vapor chamber, comprising highly conductive material.

6. A switch device having an inlet side, an outlet side, a first sidewall, and a second sidewall, the first sidewall, and the second sidewall extending from the inlet side to the outlet side, the switch device comprising:

at least one row of transceivers extending at least partially from the first sidewall to the second sidewall, where the at least one row of transceivers is configured to receive a plurality of cooling assemblies, wherein each of the plurality of cooling assemblies comprises:

a different cooling jacket configured to secure a transceiver of the at least one row of transceivers via a connecting structure;

a plurality of cooling devices secured to an exterior surface of the cooling jacket, wherein the plurality of cooling devices comprises a highly thermal conductivity material, the plurality of cooling devices including a heat pipe running along the topside of the transceiver; and a heat dissipation device connected to a distal end of each of the plurality of cooling devices.

7. The switch device of claim 6, wherein the heat dissipation device comprises a radiator connected to a pipe comprising cool water from a reservoir.

8. The switch device of claim 6, wherein the cooling jacket comprises a thermal conductivity material, selected from the group of aluminum, copper, diamond, alloys, or composite materials.

9. The switch device of claim 6, wherein the heat dissipation device comprises at least one of a heat sink, a passive heat exchanger, and a fin.

10. The switch device of claim 6, wherein the plurality of cooling devices comprises at least one heat pipe comprising highly conductive material.

11. The switch device of claim 6, wherein the plurality of cooling devices comprises at least one vapor chamber comprising highly conductive material.

* * * * *